(12) United States Patent
Chew et al.

(10) Patent No.: US 11,251,327 B2
(45) Date of Patent: Feb. 15, 2022

(54) PHOTOCOUPLER

(71) Applicant: CT Micro International Corporation, Grand Cayman (KY)

(72) Inventors: Poh-Loong Chew, Kuala Lumpur (MY); Min-Chung Chiu, New Taipei (TW)

(73) Assignee: CT Micro International Corporation, Grand Cayman (KY)

( * ) Notice: Subject to any disclaimer, the term of this patent is extended or adjusted under 35 U.S.C. 154(b) by 35 days.

(21) Appl. No.: 16/710,226

(22) Filed: Dec. 11, 2019

(65) Prior Publication Data
US 2020/0203551 A1 Jun. 25, 2020

(30) Foreign Application Priority Data

Dec. 24, 2018 (TW) .................................. 107146742

(51) Int. Cl.
*H01L 31/16* (2006.01)
*H01L 31/0232* (2014.01)
(Continued)

(52) U.S. Cl.
CPC ........ *H01L 31/16* (2013.01); *H01L 23/49537* (2013.01); *H01L 23/49541* (2013.01);
(Continued)

(58) Field of Classification Search
CPC . H01L 31/16; H01L 31/167; H01L 31/02327; H01L 25/167; H01L 23/49537; H01L 23/49541
See application file for complete search history.

(56) References Cited

U.S. PATENT DOCUMENTS 4,271,365 A * 6/1981 Adams .................... H01L 31/16
250/551
5,329,131 A * 7/1994 Wijdenes ............. G02B 6/4295
250/239
(Continued)

FOREIGN PATENT DOCUMENTS

JP 05037008 A * 2/1993

*Primary Examiner* — Robert K Carpenter
(74) *Attorney, Agent, or Firm* — Christopher R. Christenson; Kelly, Holt & Christenson PLLC

(57) ABSTRACT

Disclosed is a photocoupler comprising: at least two lead frames; an optical channel structure including a light-emitting chip, a light-sensing chip, and a light-transmissive encapsulant body, wherein the light-emitting chip and the light-sensing chip are mounted and bonded on the lead frame and are coplanar, a light-emitting surface of the light-emitting chip and a light-sensing surface of the light-sensing chip face toward the same direction, the light-transmissive encapsulant body encloses the light-emitting chip and the light-sensing chip; and a light-reflecting package encloses the light-transmitting package, and all enclosing contact surface where the light-reflecting outer package contacts the light-transmissive encapsulant body is an optical reflective surface, wherein the light-reflecting encapsulant body and the light-transmissive encapsulant body are formed by double molding and epoxy molding, so that the light-transmissive encapsulant body and the light-reflecting encapsulant body are easy to be shaped.

7 Claims, 5 Drawing Sheets

(51) Int. Cl.
*H01L 31/02* (2006.01)
*H01L 23/495* (2006.01)
*H01L 25/16* (2006.01)

(52) U.S. Cl.
CPC ...... *H01L 25/167* (2013.01); *H01L 31/02002* (2013.01); *H01L 31/02327* (2013.01)

(56) References Cited

U.S. PATENT DOCUMENTS

| | | | | |
|---|---|---|---|---|
| 5,753,929 | A * | 5/1998 | Bliss | H03K 17/7955 250/551 |
| 6,556,750 | B2 * | 4/2003 | Constantino | H01L 31/125 257/E31.096 |
| 7,476,890 | B2 * | 1/2009 | Kishi | H04B 10/564 250/214.1 |
| 9,685,578 | B2 * | 6/2017 | Chew | H01L 31/02325 |
| 2005/0023489 | A1 * | 2/2005 | Kikuchi | H01L 31/173 250/551 |
| 2011/0211790 | A1 * | 9/2011 | Kubota | H04B 10/802 385/39 |
| 2011/0235975 | A1 * | 9/2011 | Tay | H01L 31/167 385/39 |
| 2013/0181232 | A1 * | 7/2013 | Jeromerajan | H01L 31/0203 257/81 |

* cited by examiner

PHOTOCOUPLER

FIELD OF THE INVENTION

The present invention relates to an electronic component, and more particularly relates to a photocoupler.

BACKGROUND OF THE INVENTION

A photocoupler is a voltage isolator that transfers electrical signals between two isolated circuits by using light. In prior art, the photocoupler mainly includes two lead frames that are electrically isolated from each other, a light-emitting chip mounted and bonded on one of the lead frames, and a light-sensing chip mounted and bonded on the other lead frame. The light-sensing chip receives the optical signal and converts it into the electrical signal as output while the light-emitting chip is driven by an input electrical signal to convert an electrical signal into an optical signal.

A requirement of high voltage resistance for photocoupler is in necessity, so in a packaging process that the light-emitting chip and light-sensing chip are oppositely disposed, the alignment accuracy between the light-emitting chip and light-sensing chip is difficult to achieve such that not all products are capable of meeting the requirement of high voltage resistance. In the safety regulation of the photocoupler products, the product design needs to meet the requirements of external creepage distance and internal metal penetration depth. The above requirement leads a complicated manufacturing process to cause the production of thin series photocouplers to be either in poor production yield or with high defective products. A packaging structure of opposite arrangement also causes the photocoupler to have high capacitance characteristic such that, in terms of the common mode rejection noise characteristic, more additional design and cost are required for the photocoupler to avoid the interference of common mode voltage. Furthermore, although the photocouplers have been widely used in various electrical products, the characteristic of the photocouplers are unable to meet application needs since an inner encapsulant body and an outer encapsulant body in the conventional photocouplers are difficult to be shaped and a tight attachment is difficult to be formed between the inner encapsulant body and the outer encapsulant body.

SUMMARY OF THE INVENTION

Therefore, an objective of the present invention is to provide a photocoupler of which the manufacturing process is simpler, the inner encapsulant body and the outer encapsulant are easily shaped, the structure design is thinner, the specification meets safety requirement, and light transmission efficiency is better than that of the photocouplers with the packaging structure of opposite arrangement.

In order to solve the abovementioned problem, the present invention provides a photocoupler which comprises: at least two lead frames; an optical channel structure including a light-emitting chip, a light-sensing chip and a light-transmissive encapsulant body, the light-emitting chip being mounted and bonded on one of the lead frames, the light-sensing chip being mounted and bonded on another lead frame in such a manner that the light-sensing chip is on the same coplanarity with the light-emitting chip, a light-emitting surface of the light-emitting chip and a light-receiving surface of the light-sensing chip being faced toward the same direction, wherein the light-transmissive encapsulant body, enclosing the light-emitting chip and the light-sensing chip, is a light-transmissive material with a light transmittance of 20%-99%, and the at least two lead frames extend from an inner of the light-transmissive encapsulant body to outer of the light-transmissive encapsulant body; and a light-reflective encapsulant body being a light-reflective material with a light reflection of 70%-99%, the light-reflective encapsulant body fully enclosing and tightly covering the light-transmissive encapsulant body, all enclosing contact surface between the light-reflective encapsulant body and the light-transmissive encapsulant body is a light-reflective surface, and the at least two lead frames, which extends from the inner of the light-transmissive encapsulant body, further extending through an inner of the light-reflective encapsulant body to outer of the light-reflective encapsulant body, wherein the light-reflecting encapsulant body and the light-transmissive encapsulant body are formed by double molding and epoxy molding.

In one embodiment of the present invention, a photocoupler is provided, wherein the at least two lead frames are formed as bending toward a mounting direction to which the light-emitting surface of the light-emitting chip and the light-receiving surface of the light-sensing chip face.

In one embodiment of the present invention, a photocoupler is provided, wherein the material of the light-transmissive encapsulant body and the light-reflecting encapsulant body includes epoxy resin.

In one embodiment of the present invention, a photocoupler is provided, wherein a plurality of the optical channel structures are provided, and the light-reflecting encapsulant body encloses the plurality of the optical channel structures.

In one embodiment of the present invention, a photocoupler is provided, wherein a plurality of the light-emitting chips are provided in one optical channel structure.

In one embodiment of the present invention, a photocoupler is provided, wherein a plurality of the light-sensing chips are provided in one optical channel structure.

In one embodiment of the present invention, a photocoupler further comprises a voltage stabilizing chip, a current-limiting chip and/or a driving chip, wherein the voltage stabilizing chip, the current-limiting chip and/or the driving chip are mounted and bonded inside the light-transmissive encapsulant body and/or inside the light-reflecting encapsulant body.

By the technical means adopted by the present invention, the light-reflecting encapsulant body and the light-transmissive encapsulant body are formed by double molding and epoxy molding. The light-transmissive encapsulant body is easily shaped during manufacturing process. According to the required optical characteristics, a mold can be performed by a special processing and a surface treatment so that the light-transmissive encapsulant body is able to be shaped into a corresponding shape. The light-reflective encapsulant body encloses the light-transmissive encapsulant body and reflects the light emitted from the light-emitting chip.

Furthermore, comparing to the structure that the light-emitting chip and the light-sensing chip are disposed face to face, the present invention provides the light-emitting chip and the light-sensing chip being disposed side by side in a coplanar manner, which can effectively reduce the parasitic capacitance of the products to enable the products to have higher common-mode interference immunity. Besides, such kind of packaging structure has lower process difficulty, avoids risk of failure due to poor production control for product manufacture, and can greatly improve the high-voltage resistant performance and stability for the photocoupler. The photocoupler of the present invention not only meets the safety regulation of metal penetration distance but greatly lowers the size of the photocoupler, thereby meeting market demand for thinner design.

Moreover, in embodiments, the light-emitting surface of the light-emitting chip and the light-receiving surface of the light-sensing chip face toward the mounting direction. When the photocoupler of the present invention is mounted on a circuit board, the light-emitting surface of the light-emitting chip and the light-receiving surface of the light-sensing chip face the circuit board in such a manner that the amount of light transmitted from the outside of the light-reflective encapsulant body into the light-transmissive encapsulant body can be reduced by the shielding of the printed circuit board so as to prevent the light-sensing chip from the interference of external light and enable the photocoupler to be used in an environment filled with an interference of high density light source.

DETAILED DESCRIPTION OF THE PREFERRED EMBODIMENTS

Figure 1:
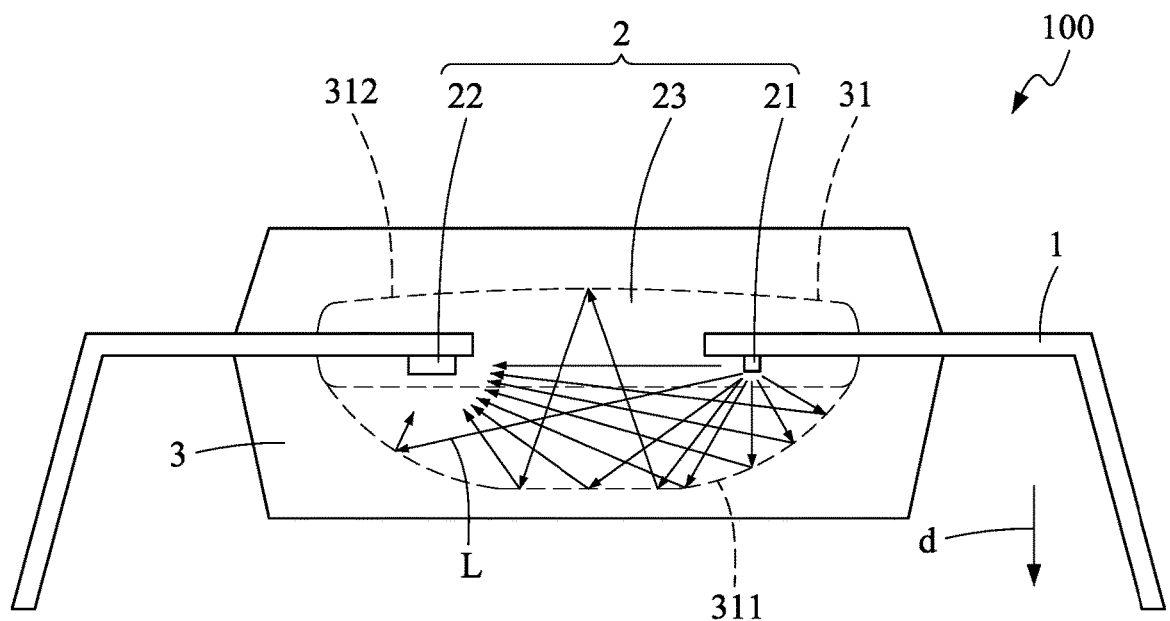
FIG. 1 is a schematic side cross-section view illustrating a photocoupler according to one embodiment of the present invention.
Figure 2:
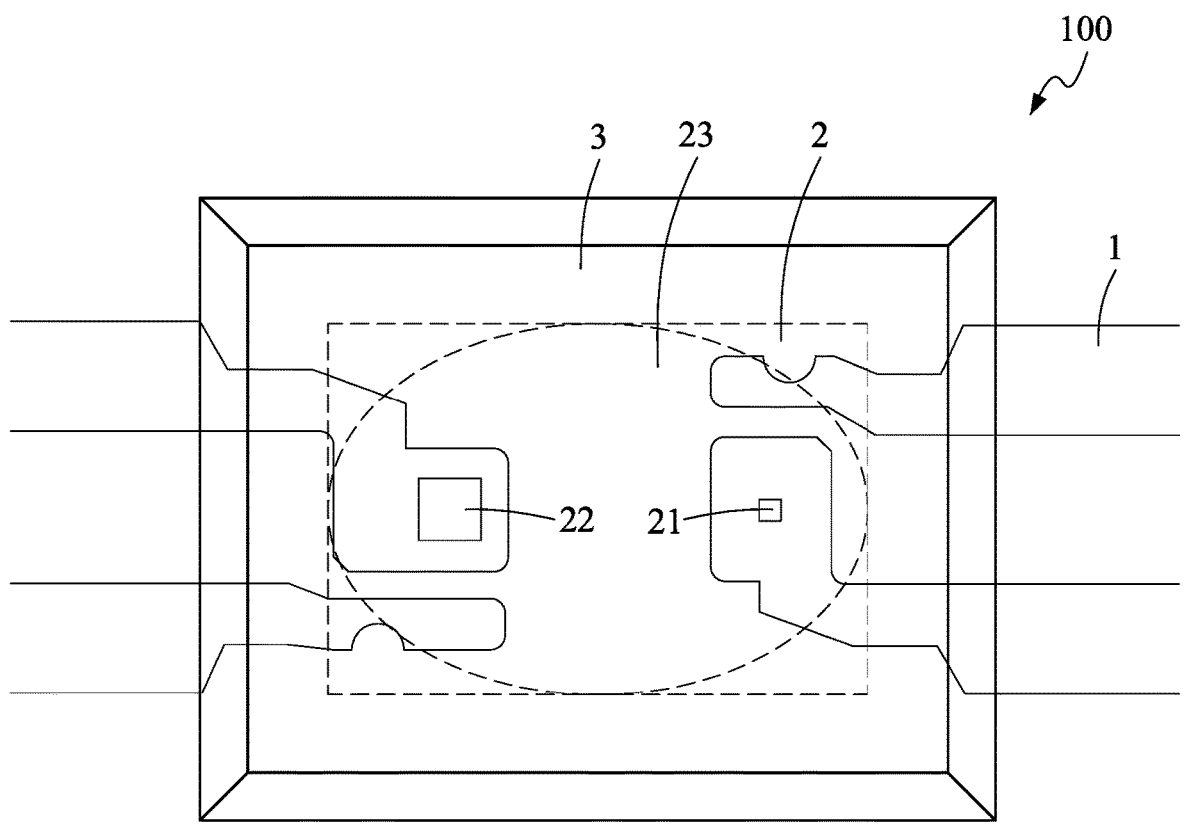
FIG. 2 is a schematic top view illustrating the photocoupler according to the embodiment of the present invention.

The preferred embodiments of the present invention are described in detail below with reference to FIG. 1 to FIG. 7. The description is used for explaining the embodiments of the present invention only, but not for limiting the scope of the claims.

As shown in FIG. 1 to FIG. 4, a photocoupler 100 according to one embodiment of the present invention comprises: two lead frames 1; an optical channel structure 2 including a light-emitting chip 21, a light-sensing chip 22 and a light-transmissive encapsulant body 23, the light-emitting chip 21 being mounted and bonded on one of the lead frames 1, the light-sensing chip 22 being mounted and bonded on the other lead frame 1 in such a manner that the light-sensing chip 22 is coplanar with the light-emitting chip 21, and a light-emitting surface of the light-emitting chip 21 and a light-receiving surface of the light-sensing chip 22 face toward the same direction, wherein the light-transmissive encapsulant body 23, enclosing the light-emitting chip 21 and the light-sensing chip 22, is a light-transmissive material with a light transmittance of 20%-99%, and the two lead frames 1 extend from an inner of the light-transmissive encapsulant body 23 to outer of the light-transmissive encapsulant body 23; and a light-reflective encapsulant body 3 being a light-reflective material with a light reflection of 70%-99%, the light-reflective encapsulant body 3 fully enclosing and tightly covering the light-transmissive encapsulant body 23, all enclosing contact surfaces between the light-reflective encapsulant body 3 and the light-transmissive encapsulant body 23 are a light-reflective surface 31, and the two lead frames 1, which extend from the inner of the light-transmissive encapsulant body 3, further extending through an inner of the light-reflective encapsulant body 3 to outer of the light-reflective encapsulant body 3, wherein the light-reflective encapsulant body 3 and the light-transmissive encapsulant body 23 are formed by double molding and epoxy molding.

Specifically, the light-transmissive encapsulant body 23 having an optical structure is formed by epoxy molding via a mold having the optical structure, the light-transmissive encapsulant body 23 is placed in another mold, and, in the mold, the light-reflective encapsulant body 3 is formed by epoxy molding with another material. By double molding and epoxy molding, the light-transmissive encapsulant body 23 is easily shaped during manufacturing process. According to the required optical characteristics, the light-transmissive encapsulant body 23 can be shaped correspondingly. The light-reflective encapsulant body 3 also can be adapted to different shapes fitting the light-transmissive encapsulant body 23 to fully enclose the light-transmissive encapsulant body 23, and a contact surface at which the light-reflective encapsulant body 3 tightly covers the light-transmissive encapsulant body 23 is formed. A dashed line shown in the figure represents the contact surface between the light-transmissive encapsulant body 23 and the light-reflective encapsulant body 3, that is, the light-reflective surface 31.

The photocoupler 100 in the present invention is a double-molding coplanar structure that the light-emitting surface of the light-emitting chip 21 and the light-receiving surface of the light-sensing chip 22 are coplanar. The light-emitting chip 21 is used to emit a light L and the light-sensing chip 22 is used to receive the light L and convert the light L into an electrical signal. The light L is reflected by the light-reflective surface 31 of the light-reflective encapsulant body 3 so as to enable the light-sensing chip 22. Specifically, the light L emitted by the light-emitting chip 21 is an infrared light or a visible light, and the wavelength of the light that can be received by the light-sensing chip 22 covers the spectral range of the light emitted by the light-emitting chip 21.

Figure 3:
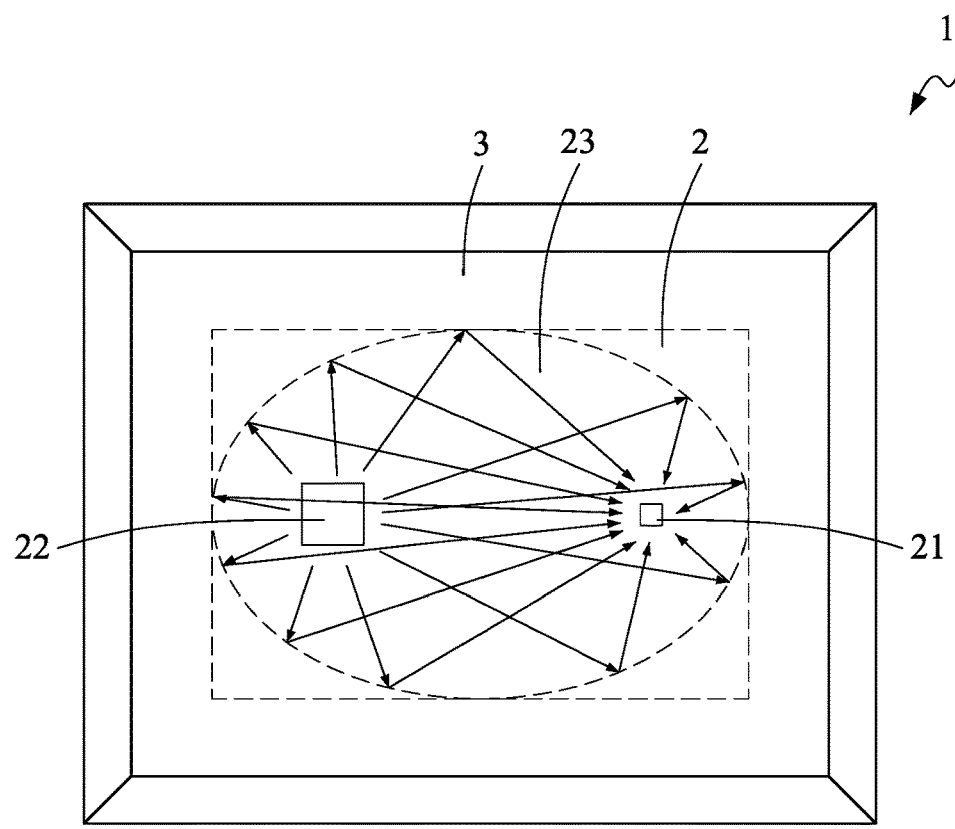
FIG. 3 is a schematic top view illustrating the photocoupler according to the embodiment of the present invention in use.
Figure 4:
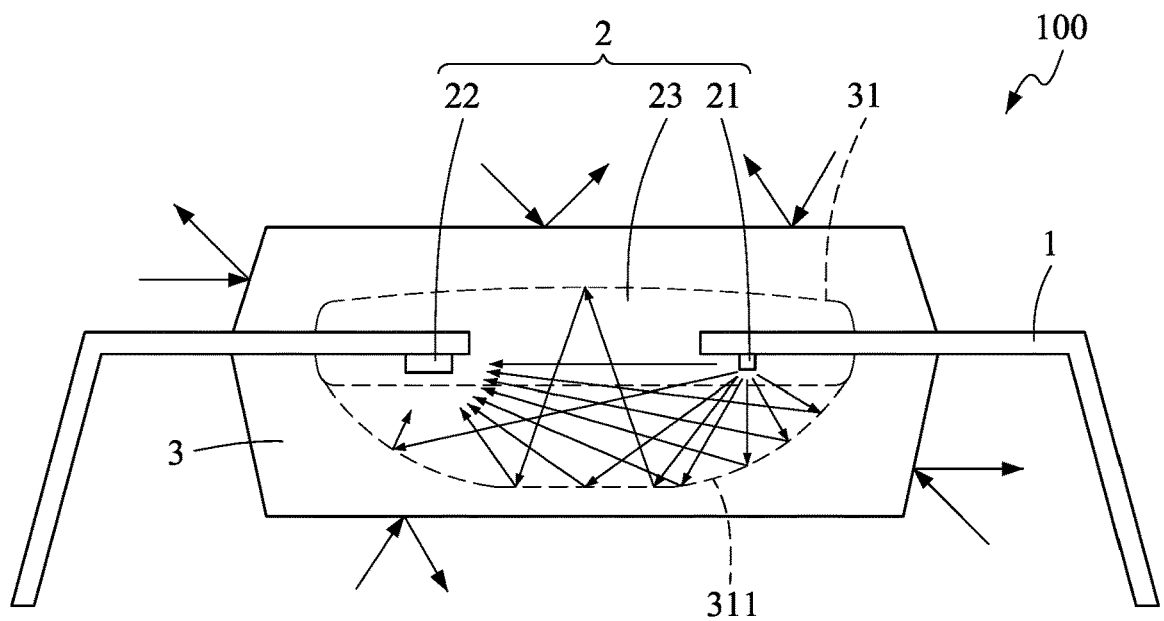
FIG. 4 is a schematic side cross-section view illustrating the photocoupler according to another embodiment of the present invention in use.

The main material of the light-transmissive encapsulant body 23 and the light-reflective encapsulant body 3 is epoxy resin. Specifically, the light-transmissive encapsulant body 23 is a light transmissive epoxy resin for light penetration. As shown in FIG. 3 and FIG. 4, the light-reflective encapsulant body 3 is also mixed with a light-reflective material to have light-reflective property so that the light L emitted from the light-emitting chip 21 is reflected on the light-reflective surface 31 of the light-reflective encapsulant body 3, and the light outside the light-reflective encapsulant body 3 is reflected and is difficult to transmit into the light-transmissive encapsulant body 23. However, the light-transmissive encapsulant body 23 may be other light-transmissive materials with similar light transmittance, and the light-reflective encapsulant body 3 may also be other materials with similar light reflection.

The light-reflective surface 31 has optical structure surfaces 311 and 312, and the light-emitting surface of the light-emitting chip 21 and the light-receiving surface of the light-sensing chip 22 face toward the optical structure surface 311 and face away from the optical structure surface 312. As shown in FIG. 1, in the embodiment, the optical structure surface 311 is an ellipsoid enabling the light-emitting chip 21 and the light-sensing chip 22 to have a good optical coupling effect. Preferably, the light-emitting chip 21 and the light-sensing chip 22 are disposed on respective focal points of the ellipsoid. In other embodiments, the optical structure surface 311 may be a sphere and a part of the optical structure surface 311 may be a plane. The optical structure surface 312 is formed corresponding to the optical structure surface 311 to enable the light that can not be reflected to the light-receiving surface by one reflection to be reflected to the light-receiving surface by two or more reflections, and further increase the optical coupling effect of the light-emitting chip 21 and the light-sensing chip 22. Because the light-reflective surface 31 in the embodiment fully encloses the light-emitting chip 21 and the light-sensing chip 22, the light L can be reflected multiple times within the range of the light-reflective surface 31.

The lead frame 1 is originally an one-piece flat lead frame, which is formed into two or more separate lead frames 1 by removing the joint after epoxy molding is finished. In the embodiment, the lead frame 1 bends toward a mounting direction d to which the light-emitting surface of the light-emitting chip and the light-receiving surface of the light-sensing chip face. Therefore, when the photocoupler 100 in the present invention is mounted on a circuit board, the light-emitting surface of the light-emitting chip 21 and the light-receiving surface of the light-sensing chip 22 are facing the circuit board in such a manner that the amount of light transmitted from the outside of the light-reflective encapsulant body 3 into the light-transmissive encapsulant body 23 can be reduced by the shielding of the circuit board so as to prevent the light-sensing chip 22 from the interference of external light. In other embodiments, the light-emitting surface of the light-emitting chip 21 and the light-receiving surface of the light-sensing chip 22 may also face away from the mounting direction d.

Figure 5:
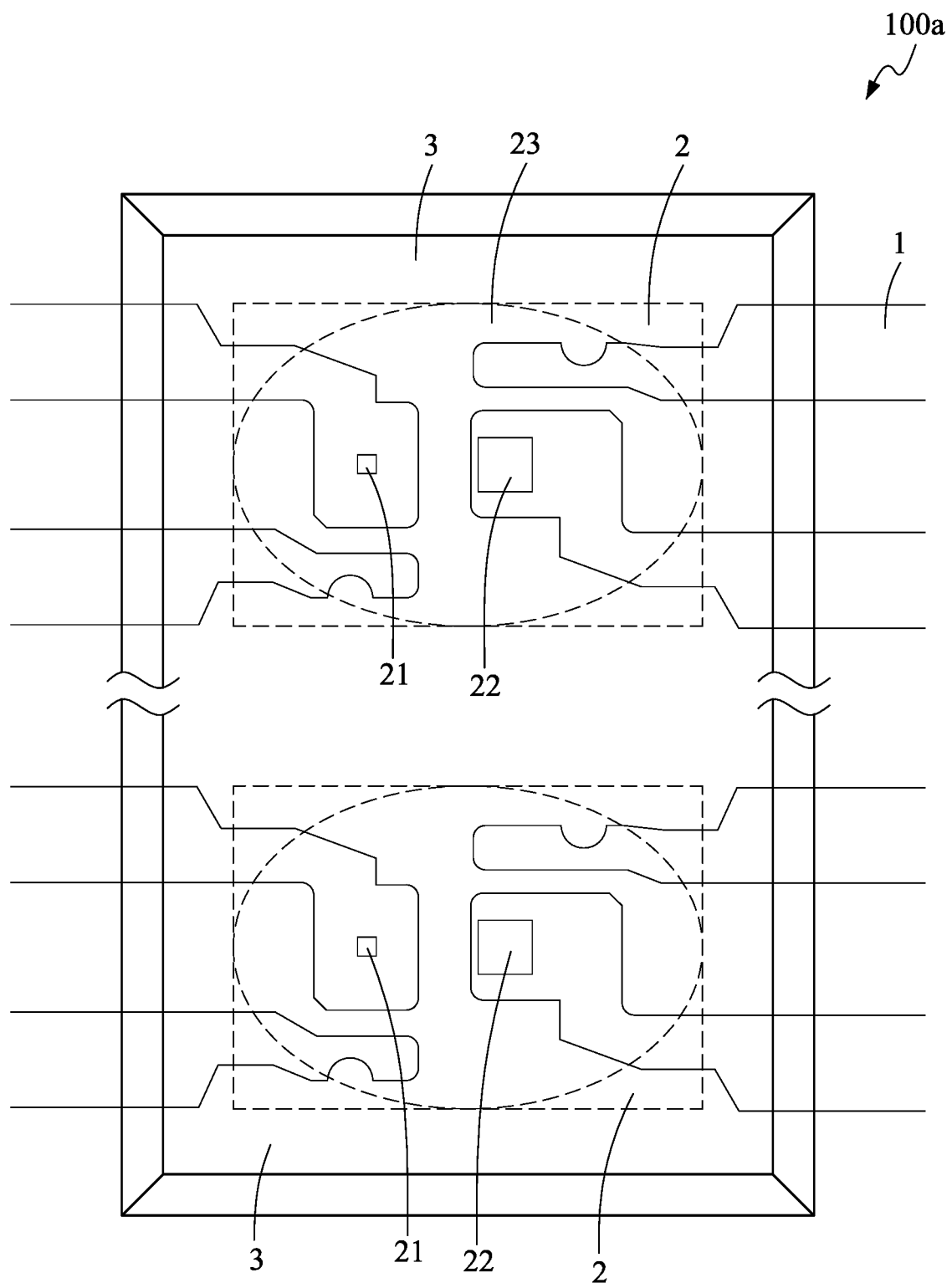
FIG. 5 is a schematic top view illustrating a photocoupler according to another embodiment of the present invention.

As shown in FIG. 5, a photocoupler 100a according to another embodiment of the present invention is a multichannel photocoupler having a plurality of the optical channel structures 2, and the light-reflective encapsulant body 3 encloses the plurality of the optical channel structures. In the embodiment, the light-transmissive encapsulant bodies 23 of the plurality of the optical channel structures have the same shape. In the embodiment that the plurality of the optical channel structures 2 have different optical characteristics, the plurality of the optical channel structures 2 may also have different shapes of the light-transmissive encapsulant body.

Figure 6:
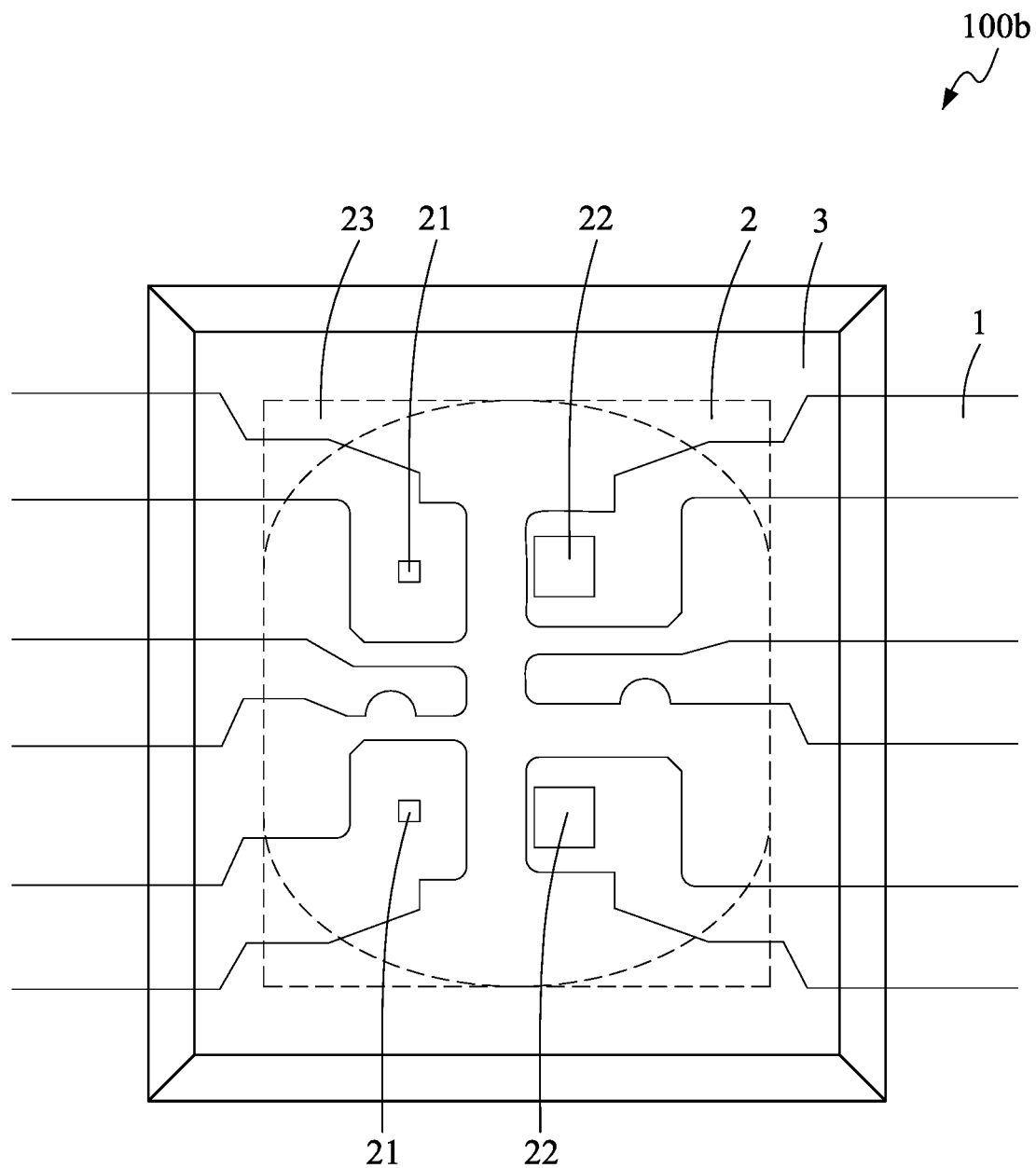
FIG. 6 is a schematic top view illustrating a photocoupler according to another embodiment of the present invention.

As shown in FIG. 6, a photocoupler 100b according to another embodiment of the present invention is provided with one optical channel structure 2. Two light-emitting chips 21 and two light-sensing chips 22 are provided in the optical channel structure 2. When one of the light-emitting chips 21 emits light, the two light-sensing chips 22 receive light. In other embodiments, the relationship between the number of the light-emitting chip and the number of the light-sensing chip may also be one-to-many or many-to-one.

Figure 7:
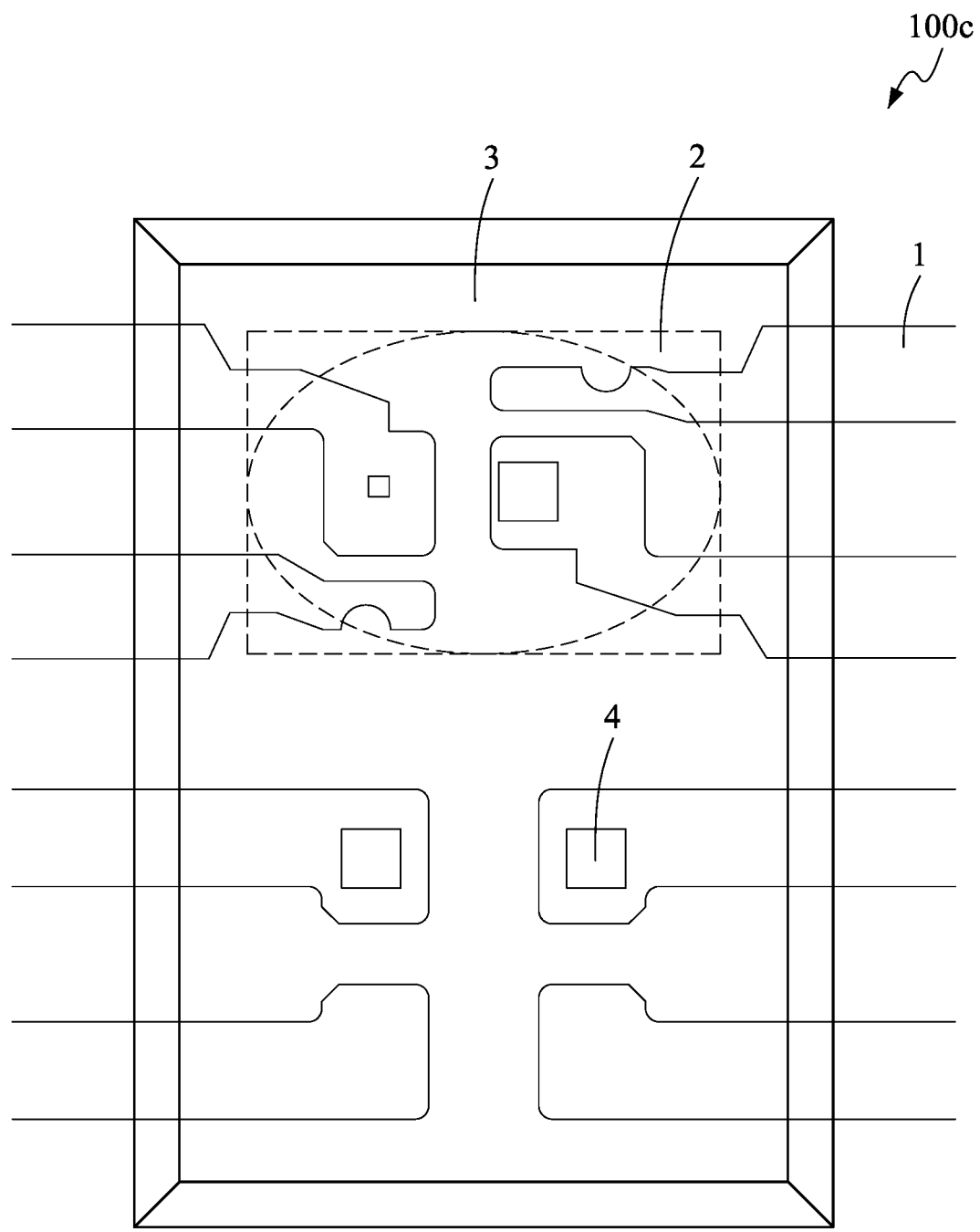
FIG. 7 is a schematic top view illustrating a photocoupler according to another embodiment of the present invention.

As shown in FIG. 7, a photocoupler 100c according to another embodiment of the present invention further comprises a functional device 4. The functional device 4 can be an electronic component, such as a voltage stabilizing chip, a current-limiting chip, a driving chip, a power component, and MOSFET. The functional device 4 is disposed on the lead frame 1 inside the light-reflective encapsulant body 3 to integrate multiple functions in the photocoupler 100. In the embodiment, the functional device 4 is disposed between an inner surface and an outer surface of the light-reflective encapsulant body 3 to be enclosed by the light-reflective encapsulant body 3. In other embodiments, the functional device 4 may also be disposed inside the light-transmissive encapsulant body 23 to be enclosed by the light-transmissive encapsulant body 23.

The above description should be considered only as an explanation of the preferred embodiment of the present invention. A person with ordinary skill in the art can make various modifications to the present invention based on the scope of the claims and the above description. However, those modifications shall fall within the scope of the present invention.

What is claimed is:

1. A photocoupler, comprising:
    at least two lead frames;
    an optical channel structure including a light-emitting chip, a light-sensing chip and a light-transmissive encapsulant body, the light-emitting chip being disposed on one of the lead frames, the light-sensing chip being disposed on another of the lead frames in such a manner that the light-sensing chip is coplanar with the light-emitting chip, a light-emitting surface of the light-emitting chip and a light-receiving surface of the light-sensing chip being faced toward the same direction, wherein the light-transmissive encapsulant body, enclosing the light-emitting chip and the light-sensing chip, is a light-transmissive material with a light transmittance of 20%-99%, and the at least two lead frames extend from an inner surface of the light-transmissive encapsulant body to an outer surface of the light-transmissive encapsulant body; and
    a light-reflective encapsulant body being a light-reflective material with a light reflectance of 70%-99%, the light-reflective encapsulant body fully enclosing and directly covering the light-transmissive encapsulant body, all enclosing contact surface between the light-reflective encapsulant body and the light-transmissive encapsulant body being a light-reflective surface, the light-reflective surface having a front optical structure surface and a rear optical structure surface, the front optical structure surface facing toward the light-emitting surface of the light-emitting chip and the light-receiving surface of the light-sensing chip, and the rear optical structure surface facing toward the front optical structure surface, wherein the rear optical structure surface is formed with an entirely curved surface whose curvature is corresponding to the front optical structure surface to enable the light, which is not emitted directly from the light-emitting surface to the light-receiving surface and which is not only one-time reflected by the front optical structure surface to the light-receiving surface from the light-emitting surface, is allowed to be reflected by the rear optical structure surface to the alit-receiving surface, and the at least two lead frames, which extends from the inner surface of the light-transmissive encapsulant body, further extending through an inner surface of the light-reflective encapsulant body to an outer surface of the light-reflective encapsulant body,
    wherein the light-reflective encapsulant body and the light-transmissive encapsulant body are formed by double molding and epoxy molding.

2. A photocoupler according to claim 1, wherein the at least two lead frames are formed as bending toward a mounting direction to which the light-emitting surface of the light-emitting chip and the light-receiving surface of the light-sensing chip face.

3. A photocoupler according to claim 1, wherein the material of the light-transmissive encapsulant body and the light-reflecting encapsulant body includes epoxy resin.

4. A photocoupler according to claim 1, wherein a plurality of the optical channel structures are provided, and the light-reflecting encapsulant body encloses the plurality of the optical channel structures.

5. A photocoupler according to claim 1, wherein a plurality of the light-emitting chips are provided in one optical channel structure.

6. A photocoupler according to claim 1, wherein a plurality of the light-sensing chips are provided in one optical channel structure.

7. A photocoupler according to claim 1, further comprising a voltage stabilizing chip, a current-limiting chip and/or a driving chip, wherein the voltage stabilizing chip the current-limiting chip and/or the driving chip are disposed inside the light-transmissive encapsulant body and/or inside the light-reflecting encapsulant body.

* * * * *